(12) United States Patent
Morrison et al.

(10) Patent No.: US 9,825,436 B2
(45) Date of Patent: Nov. 21, 2017

(54) METHOD FOR INTEGRATING A DETACHABLE INTERCONNECTION MODULE IN A CABINET, CABINET THUS FITTED, AND AIRCRAFT COMPRISING A BAY CONSISTING OF SUCH CABINETS

(71) Applicant: LATELEC, Labege (FR)

(72) Inventors: Damien Morrison, Toulouse (FR); Bastien Puertolas, Castanet Toulousan (FR); Cyrille Delame, Saint Orens (FR); Gerard Boucourt, Rouffiac Tolosan (FR); Martial Grimm, Fenouillet (FR); Bernard Amalric, L'Union (FR); Vincent Banasiak, Toulouse (FR); Jean Charles Bernadac, Castanet Tolosan (FR); Olivier Escalaup, Raimonvilli Saint Agne (FR); Philippe Gri, Saint Genies Bellevue (FR)

(73) Assignee: Latelec, Labege (FR)

( * ) Notice: Subject to any disclaimer, the term of this patent is extended or adjusted under 35 U.S.C. 154(b) by 157 days.

(21) Appl. No.: 14/898,157

(22) PCT Filed: Jun. 14, 2014

(86) PCT No.: PCT/EP2014/062487
§ 371 (c)(1),
(2) Date: Dec. 14, 2015

(87) PCT Pub. No.: WO2014/198957
PCT Pub. Date: Dec. 18, 2014

(65) Prior Publication Data
US 2016/0149381 A1      May 26, 2016

(30) Foreign Application Priority Data

Jun. 15, 2013   (FR) ..................... 13 55612

(51) Int. Cl.
   *H02B 1/26*   (2006.01)
   *H05K 7/14*   (2006.01)
   (Continued)

(52) U.S. Cl.
   CPC ............... *H02B 1/26* (2013.01); *B64D 43/00* (2013.01); *H05K 7/1447* (2013.01); *H05K 7/20563* (2013.01)

(58) Field of Classification Search
   CPC ........ H02B 1/26; B64D 43/00; H05K 7/1447; H05K 7/20563
   See application file for complete search history.

(56) References Cited

U.S. PATENT DOCUMENTS 5,786,995 A * 7/1998 Coleman ................ B64D 43/00
                                                                700/83
6,038,130 A * 3/2000 Boeck .................. H01R 9/2675
                                                                361/729

(Continued)

FOREIGN PATENT DOCUMENTS

FR        2822130        9/2002
FR        2927222        8/2009

(Continued)

*Primary Examiner* — Valentina Xavier
(74) *Attorney, Agent, or Firm* — Defillo & Associates; Evelyn A. Defillo

(57) ABSTRACT

The invention relates to optimize the use of electronic cabinets in connector technology, using simplified internal connector technology and flexibility in adapting the external connector technology to the connectors of the cabling assemblies—electronic and/or optical connector technologies—and on the structurally. To this end, according to an embodiment, an overall box-shaped electronic cabinet (1) that is fitted with at least one detachable interconnection module (6a, 6b) is provided with a bottom wall (14) including a bottom card (4) connected to a set of electronic modules (5). The rear wall (14) is extended by edges (14a, (Continued)

14*b*) provided with connectors (C1*a*, C1*b*) that are capable of being coupled to the connectors (C6*a*, C6*b*) that are arranged on a side surface (62*a*, 62*b*) of the detachable interconnection module (6*a*) (6*b*). Devices for closing and releasably locking the at least one detachable interconnection module (6*a*, 6*b*) are provided between a handle (8*a*, 8*b*) of an interconnection module (6; 6*a*, 6*b*) and the side wall (15, 16) of the cabinet (1).

13 Claims, 6 Drawing Sheets

(51) Int. Cl.
*H05K 7/20* (2006.01)
*B64D 43/00* (2006.01)

(56) References Cited

U.S. PATENT DOCUMENTS

| | | | |
|---|---|---|---|
| 9,606,577 B2* | 3/2017 | Sullivan | G06F 1/16 |
| 2006/0087814 A1* | 4/2006 | Brandon | H05K 7/20563 361/694 |
| 2012/0151098 A1* | 6/2012 | Sullivan | G06F 1/1607 710/13 |
| 2015/0029675 A1* | 1/2015 | Rossman | H05K 7/1447 361/726 |

FOREIGN PATENT DOCUMENTS

| | | |
|---|---|---|
| FR | 2977446 | 1/2013 |
| FR | 2977447 | 1/2013 |

* cited by examiner

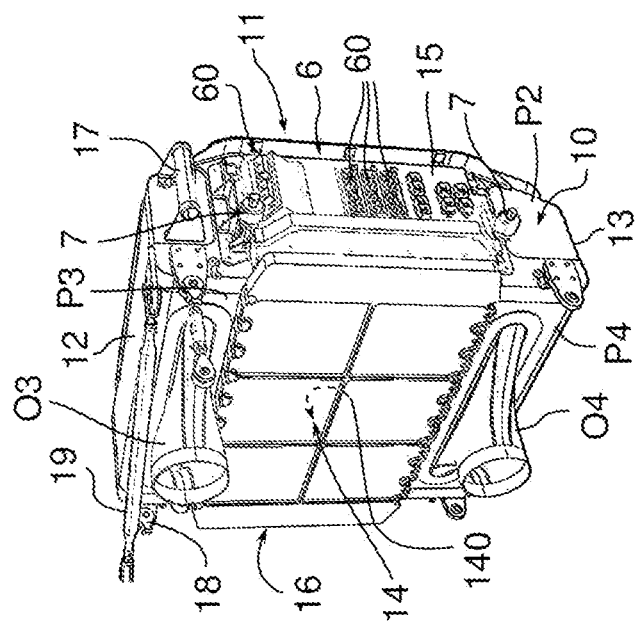
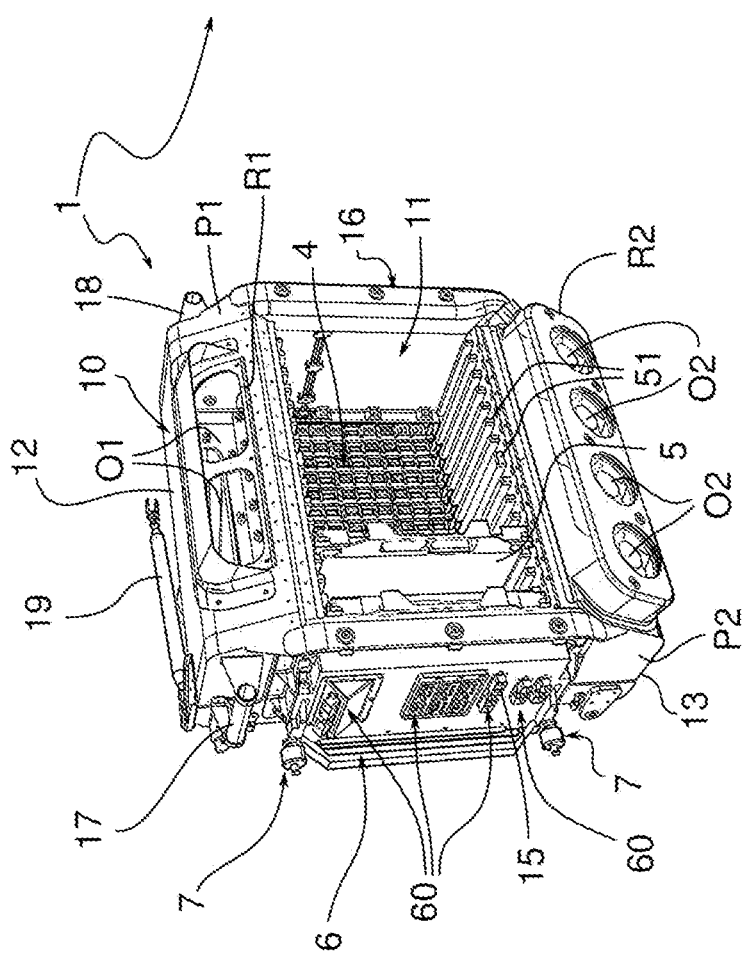
Figure 1a
Figure 1b

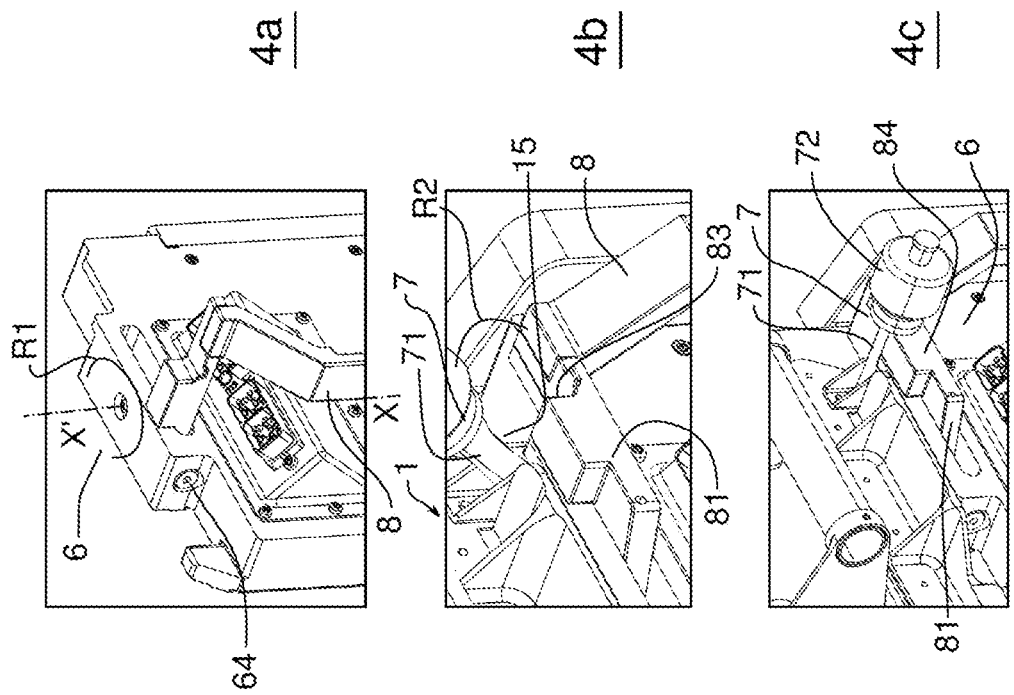
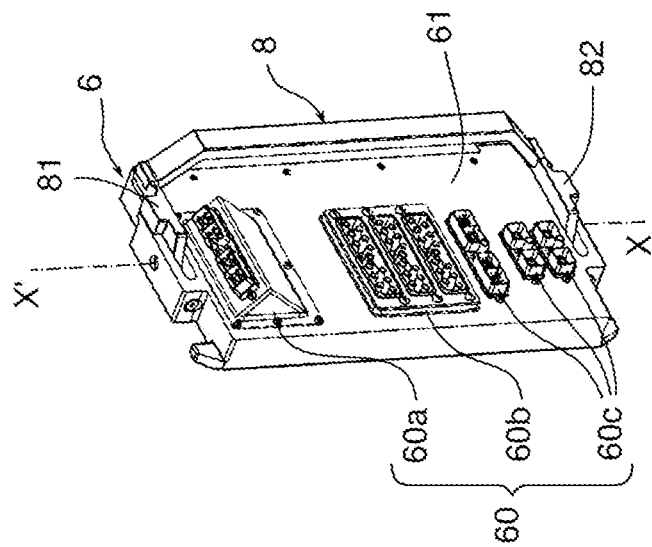

METHOD FOR INTEGRATING A DETACHABLE INTERCONNECTION MODULE IN A CABINET, CABINET THUS FITTED, AND AIRCRAFT COMPRISING A BAY CONSISTING OF SUCH CABINETS

CROSS REFERENCE TO RELATED APPLICATION

This application is a national stage entry of PCT/EP2014/062487 filed Jun. 14, 2014, under the International Convention claiming priority over French Patent Application No. 1355612 filed Jun. 15, 2013.

TECHNICAL FIELD

The invention relates to a method for integrating an avionic cabling assembly interconnection module in an electronic housing cabinet and for connecting electronic modules. The invention also relates to an electronic cabinet equipped with at least one interconnection module of this type, as well as to an aircraft comprising an avionic bay consisting of a set of cabinets of this type for connecting the electric/electronic equipment via cabling distributed in that aircraft.

The invention relates to the field of avionics and generally applies to hardware for the electric/electronic processing and management of the equipment of an aircraft: electrical centers, computers, power modules, inertial systems, controls and associated functions (converters, etc.). The hardware, which generally comprises cards and electronic components, is produced in the form of a multitude of electronic modules—called "blades" in English terminology—integrated in cabinets. The assembly of these cabinets constitutes an avionics bay.

The cabinets are produced in the form of box-shaped cases equipped with means of housing electronic modules in the vertical position, parallel with each other. These cabinets are equipped with openings for the ventilation of the electronic modules and with a connection interface in order to couple the avionics bay with different operational equipment of the aircraft according to a network architecture, via assemblies of bundles of electric/optical cables as well as an on-board electrical power supply network. In general, the operational equipment is distributed along the fuselage and in the wings of the airplane.

The avionics bay is preferably located in the front lower part of the fuselage, under the cockpit, in controlled pressure and temperature conditions: stable ambient pressure (pressurized zone of the aircraft), and controlled temperature. Mechanical structures, known as "chairs", are usually provided in the access area of the bay in order to allow maintenance of the cabinets in liaison with their immediate environment and to allow a passage for the ventilation air flows of these cabinets.

Each chair is principally constituted by a horizontal support panel equipped with locking means, a rear panel with openings—to allow the passage of the bundles of cables—and lateral struts. Such an installation is defined by an international aeronautical standard: ARINC600. An assembly according to this standard is for example described in the patent document U.S. Pat. No. 6,797,879.

BACKGROUND OF THE INVENTION

Because of the increase and diversification of equipment, the result of this is an increase in the quantity and complexity of the connector technology of the cabinets: multiplication of the cablings, connections of electric and optical nature, difficult handling in a small available space. There is also a resulting increase in weight and costs (long maintenance cycle times, greatly increased computing power requirement, ever increasing number of cables and functions, etc.) and an unsuitability for new equipment having a different connector technology from the one initially provided. Moreover, heat dissipation is no longer correctly ensured because the ventilation is inadequate with the increase in the number of cabling assemblies and of the performance required by the new equipment.

In order to try to overcome at least some of these disadvantages, the patent document FR 2 927 222 describes an electronic rack installed in an aircraft in which a "function module" of the electronic modules and an interface module of the external connectors of the motherboard are arranged in a juxtaposed manner on the front face of the rack, is such a way as to facilitate access to the electronic modules and to the external connectors through the front face. This system eliminates the connector technology on the rear face so that all of the connections are made on the front face of the racks. However, this arrangement considerably increases the connection density of the cabling on this face.

From the patent document FR 2 822 130 there is also known a cabling network architecture in which intermediate interconnection modules are connected to each other by identical cabling cords and connected to interconnection end modules connected to cabling assemblies adapted to the terminal devices. This architecture makes it possible to simplify the identification of the connections to be made but multiplies the number of interconnection modules by adding intermediate interconnection modules.

SUMMARY OF THE INVENTION

In the prior art, the electronic modules provide the complex function of electronic conversion and of optoelectronic conversion, of lightning protection or also of separate filtering between separate clean zones and dirty zones, the handling of these modules then giving rise to risk of damage, of misalignment and of soiling. In particular, interventions on modules connected to optical fibers require a specialized technique for the connection/disconnection of these fibers.

The purpose of the invention is to optimize the use of electronic cabinets with regard to avionic architecture, with a simplified connector technology inside the cabinets and a flexibility in adapting the external connector technology to the connectors of the cabling assemblies—electronic and/or optical connector technologies—as well as structurally: a special ventilation path for the electronic modules in a chassis having a configuration appropriate for the connector technology and for the ventilation, whilst being compatible with a reduction of weight by the use of specific materials, and a specific mounting of the cabinet on the primary aircraft structure allowing periodic uncoupling.

Moreover, the invention aims to provide more modularity whilst controlling the environmental conditions of the elements forming it and therefore allowing a partial requalification of these elements, in particular more modularity to the electronic modules, as well as simple and safe intervention.

In order to do this, the invention provides for carrying out a conversion function shifted to an end portion of the cabinet coupled to a detachable modular interconnection in liaison with the cabling assemblies of the avionic architecture.

More precisely, the present invention relates to a method for integrating an avionic cabling assembly interconnection module in an electronic cabinet for housing and connecting electronic modules comprising a front face, a back panel having an internal face provided with a card for connection to said electronic modules and two lateral walls having external faces. This method comprises:

moving, parallel with a lateral wall of the cabinet, at least one interconnection module comprising connectors, towards said cabling assemblies on a principal external face and a connection circuit on a lateral face, inserting said interconnection module in a lateral housing space limited by the external face of said lateral wall and edges respectively extending the back panel and the front face, mechanically connecting the ends of a handle mounted, such that it pivots vertically on said module, with fixed points on the external face of said lateral face, pivoting the handle in such a way that said handle ends rotate about fixed points in order to move said module in translation along the external face of the lateral wall and that connection circuits, arranged on a lateral face of said interconnection module in liaison with the connectors of said principal external face and on the internal face of said edge of back panel in liaison with the connectors of the electronic modules of the back panel, become closed one upon the other so that it is possible to couple the cabling assemblies with the electronic modules, and locking said module in the closed position by reversible mechanical clamping between said lateral wall and said interconnection module.

The invention also relates to an overall box-shaped electronic cabinet for aircraft, equipped with at least one detachable interconnection module comprising connectors for coupling to cabling connectors leading to equipment of the aircraft. The cabinet is formed from a chassis defining a front face, an upper panel, a lower panel, a back panel parallel with the front face, and two parallel lateral walls. The back panel comprises a back card, called a backplane, able to be connected to a set of electronic modules intended to be housed in the cabinet whilst remaining extractable from the front face. In this cabinet, the rear wall is extended by edges provided with connectors able to be coupled with connectors arranged on a lateral face of the detachable interconnection module. The connectors of the edges of the rear wall are coupled with the back panel card by a multi-layer connection printed circuit. Means of closing and releasably locking said at least one detachable interconnection module are provided between an interconnection module handle and the lateral wall of the cabinet against which said module is able to be placed in order to couple, in a reversible manner, the edge connectors of the rear wall with the lateral face connectors of the interconnection module, the connectors for coupling with the cabling of the aircraft being arranged on an external face of said interconnection module in liaison with said lateral face connectors.

The releasable lateral connection makes it possible to reduce the dimensions generated by the volumes occupied by the cabling and to adapt the electric and optical connections between the connectors of the detachable interconnection module coupled with the aircraft cabling connector technology and the electronic modules of the cabinet via appropriate high data rate protocols, in particular Ethernet protocols.

Advantageously, the cabinet according to the invention makes it possible to transmit fast bidirectional information using optical fibers, via a bidirectional optical/electric conversion interface card, between the connectors of the detachable interconnection module coupled to the aircraft cabling connector technology and the electronic modules of the cabinet, which makes it possible to overcome the problems of integration.

In an advantageous variant, at least one dissipator is mounted on an external face of the multi-layer printed circuit in order to facilitate the evacuation of calories by conduction or convection.

According to preferred embodiments:

the cabinet is essentially constituted by a low-density material chosen from aluminum-based metal alloys and composite materials based on carbon fibers;

the bidirectional optical/electric conversion interface card is integrated in a printed circuit coupled to the connectors of the edges of the rear wall via a multi-layer connector for conveying heavy current, each layer of the connector being able to be inserted by force in a terminal for connection to the printed circuit and at least one dissipator being able to be mounted on an external face of the multi-layer connector;

the optical/electric conversion interface card comprises a transmitter/receiver associated with two distributed amplification reclockers;

the means of closing the interconnection modules comprise hooks mounted at the ends of the handle of the interconnection module, these hooks are mounted engaged on lugs in order to pivot about these lugs by rotation of the handle and to move the interconnection module in translation until it reaches the extended edges of the rear wall in the closed position, and the locking means comprise a lever coming from the side wall and able to lock the handle in the closed position by clamped connection;

the chassis of the cabinet comprises intermediate inclined or vertical walls between the upper and lower panels and respectively at least one of the front and/or rear faces, these intermediate walls being provided with ventilation openings in order to allow a single or double flow of ventilation air in the cabinet between the openings of the intermediate walls formed in liaison with a same face;

the cabinet has a self-supporting suspension by rods structure able to allow the installation of the cabinet in a housing area of the aircraft making it possible to allow periodic decoupling.

The invention also relates to an aircraft comprising an avionics bay constituted by a set of cabinets such as defined above and arranged in such a way as to allow a flow of air between them and to transmit electric/optical control signals to equipment of the aircraft via electric and/or optical cabling assemblies.

According to a preferred embodiment, the aircraft comprising a fuselage, wings, a cockpit, a cockpit floor, a nose hold and a cargo hold, the cabinets of the bay are arranged in the nose hold, the cargo hold and/or the floor of the cockpit. The aircraft is provided with electric/electronic equipment distributed in the fuselage and the wings of the aircraft and coupled with the cabinets in the bay via electric and/or optical cabling assemblies spread out according to an architecture integrating the distribution of the equipment in the aircraft.

BRIEF DESCRIPTION OF THE FIGURES

Other information, features and advantages of the present invention will become apparent on reading the following non-limited description, given with reference to the appended figures in which:

FIGS. 1a and 1b show general front and rear views in perspective of an example of an electronic cabinet according to the invention;

FIG. 3 is a perspective view of an example of an interconnection module according to the invention;

FIG. 4 shows partial views in perspective 4a to 4c of an example of a detachable interconnection module with a handle in the open position (view 4a) and in the closed position before (view 4b) and after (view 4c) locking;

DETAILED DESCRIPTION OF THE INVENTION

Figure 2:
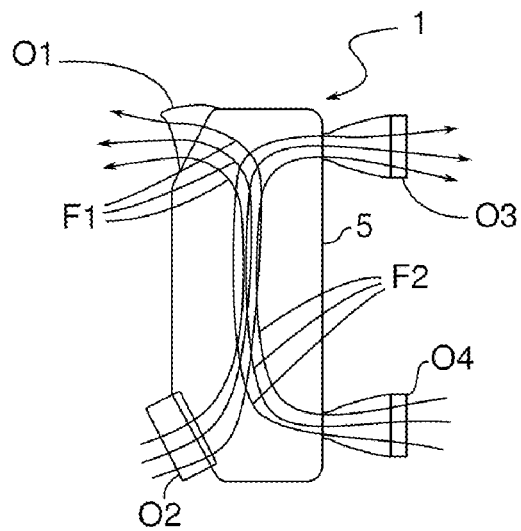
FIG. 2 is a lateral cross-sectional view of the cabinet shown in FIG. 1 with plots of the ventilation air flows.

In the present text, the qualifiers "front", "rear", "below", "above", "upper", "lower", "vertical", "horizontal" and their derivatives or equivalents refer to relative arrangements of parts of elements in a standard configuration of use, notably with respect to an aircraft on the ground. The qualifier "lateral" refers to faces or walls having dimensions substantially less than the principal faces or walls of substantially larger dimensions of a same element. The qualifiers "internal" and "external" refer to faces oriented towards the inside or towards the outside of the electronic cabinet according to the invention.

With reference to the front and rear perspective views of FIGS. 1a and 1b, an electronic cabinet 1 according to the invention is formed by an overall box-shaped chassis 10 comprising a front face 11, an upper panel 12, a lower panel 13, a back panel 14 parallel with the front face 11, and two lateral and parallel walls 15 and 16.

The back panel 14 comprises on an internal wall 140 a back card 4, called a back plane, connected to a set of electronic modules, such as the electronic module 5, mounted on slides 51. The electronic modules are housed in the cabinet 1 parallel with the lateral walls 15 and 16. The electronic modules remain extractable through the front face 11. The electronic modules are interchangeable without the use of a tool and without restricted handling because the cabling assemblies are all connected by the detachable interconnection module. Thus, the durations of maintenance cycles are substantially improved.

The cabinet 1 also has movable carrying handles 17 and 18 mounted at the ends of the upper panel 12 and a rod 19 for withdrawing the cabinet 1. The cabinet 1 is in fact mounted on the primary structure of the aircraft by means of a rod 19 suspension system which allows periodic decoupling. More generally, such mechanical suspension structures using rods in the zone housing cabinets make it possible to allow periodic decoupling of these cabinets in order to isolate them from aircraft modes. Moreover, the cabinet is self supporting and does not therefore require secondary structures such as chairs.

Moreover, an interconnection module 6 is releasably locked on the lateral wall 15 by two levers 7 coming from that wall. Connectors 60 are mounted on the interconnection module 6. These connectors are intended to be coupled with the connectors of the cabling assemblies of the equipment distributed in the aircraft—called aircraft cabling—as will be described in detail below.

Moreover, the chassis 10 comprises two intermediate inclined walls P1 and P2 (FIG. 1a) between, respectively, the panels 12, 13 and the front face 11. These walls P1 and P2 are provided with rows R1 and R2 of ventilation openings, respectively two openings O1 and four openings O2. Moreover, the back panel 14 comprises (FIG. 1b), on intermediate walls P3 and P4 (FIG. 1b), at the edge of each panel 12 and 13, an air flow nozzle, O3 and O4 respectively.

The chassis of the cabinet 1 is essentially constituted by a low-density material, in this case an aluminum-based metal alloy in order to allow protection against environmental electromagnetic interference. It can also be made from a material based on carbon fibers in order to improve performance in terms of weight.

The cross-sectional lateral view in FIG. 2 shows the flow of air in the cabinet 1, symbolized by the sets of arrows F1 and F2. According to a main air flow system, the air enters into the lower openings O2 and emerges through the upper openings O1 (arrows F1) on the same front face 11 (FIG. 1a). The openings O1 and O2 constitute a main forced conditioned air flow. Another forced air flow system is constituted by the lower opening O4 and the upper opening O3, these openings O3 and O4 being arranged on the panels P3 and P4 of the rear wall 14 (FIG. 1b). According to an advantageous embodiment, the electronic modules 5 can be alternatively ventilated by one or the other of the two flow systems. According to a particular embodiment, the second flow through the openings O3-O4 (arrows F2) can constitute a back-up flow in the case of failure of the main flow system through the openings O1-O2 (arrows F1).

The positioning of an interconnection module 6 will now be described with reference to FIGS. 3 to 5. The interconnection module 6 exhibits, in a detailed manner in the example embodiment shown in 3, the connectors 60 dedicated to the transmission of signals to the aircraft cabling assemblies: optical communication connectors 60a, connectors 60b for transmission of signals in an Ethernet network and connectors 60c of power cables. All of these connectors are mounted on the external face 61 of the interconnection module 6.

The interconnection module 6 is provided with a generally vertical handle 8, able to be articulated at its two horizontal ends 81 and 82 about a central vertical axis X'X. The partial views 4a to 4c of FIG. 4 illustrate the locking of the interconnection module 6 in the cabinet 1.

In the partial view 4a shown in FIG. 4, the handle 8 of the interconnection module 6 is shown in the storage mode with the handle 8 locked in the so-called open position by a locking screw 64.

Referring to the views 4a and 4b of FIG. 4, said module 6 is in the mode of closing and then locking in said cabinet 1. The closed position against the lateral wall 15 of the cabinet 1 is acquired by pivoting the handle 8 through 90° about the axis X'X (circular arrow R1 in view 4a). The horizontal ends 81 and 82 (only the end 81 is seen in the partial view 4b) then come against the lateral wall 15.

The lever 7, which is initially in the raised position in view 4b, is then lowered (arrow R2) so that its arm 71 engages in a shoulder 83 of the handle 8 (view 4c of FIG. 4). The head 72, arranged at the end of the arm 71 of the lever 7, is clamped against the external face 84 of the handle end 81. The interconnection module 6 is then locked on the lateral wall 15 of the cabinet 1 (see FIG. 1a). The locking is releasable by loosening the head 72 and extracting the interconnection module 6 from the lateral wall 15 of the cabinet 1.

Figure 5:
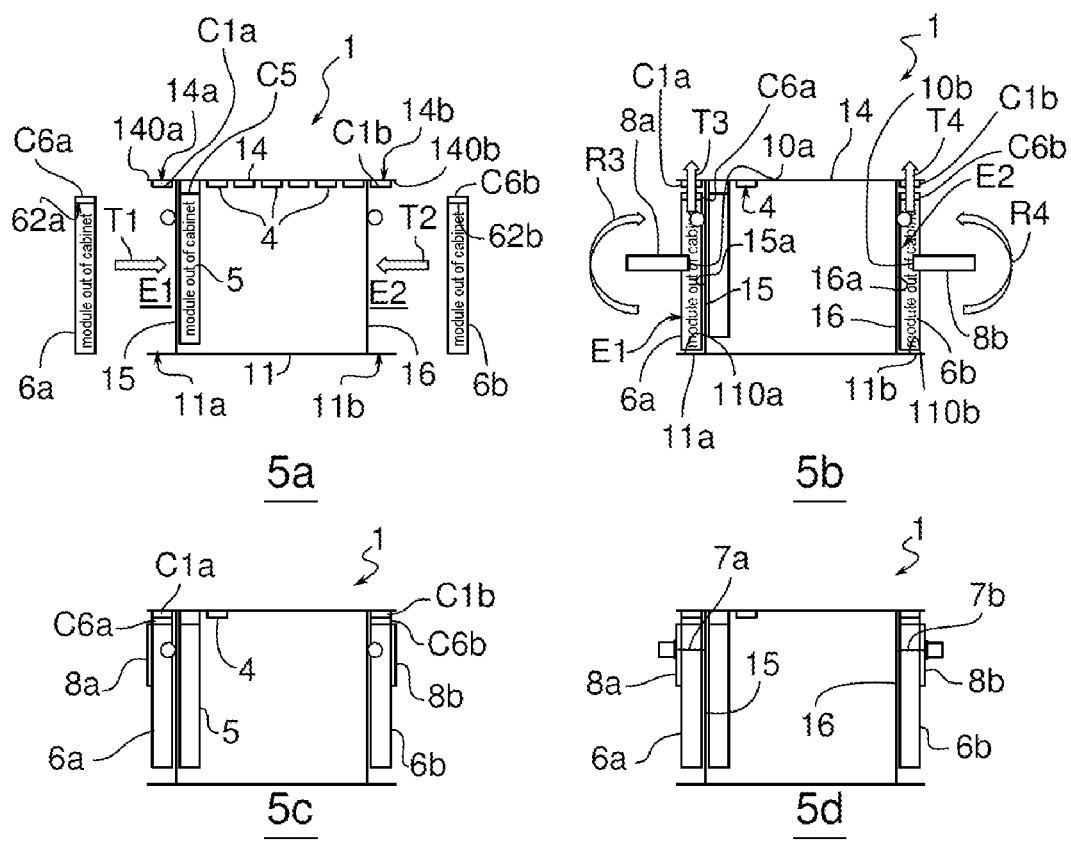
FIG. 5 shows diagrams 5a to 5d of successive steps of integration of the interconnection module in the electronic cabinet by insertion, closing and locking.

FIG. 5 diagrammatically illustrates the integration kinematics into and, by reverse kinematics, the extraction kinematics of the interconnection modules 6a and 6b from the electronic cabinet 1 equipped with the blade 5, by diagrams 5a to 5d of successive steps of insertion, closure and locking.

In diagram 5a, the modules 6a and 6b are brought towards the cabinet 1 parallel (translation arrows T1 and T2) with the lateral walls 15 and 16 of that cabinet 1, in such a way as to be able to become inserted in lateral spaces E1 and E2. These housing spaces are limited by the lateral walls 15 and 16 and edges 14a, 14b and 11a, 11b respectively extending the back panel 14 and the front face 11 of the cabinet 1. The internal faces 140a and 140b of the edges 14a, 14b of the back panel 14 and the lateral faces 62a, 62b of the interconnection modules 6a, 6b are fitted with connection circuits or connectors, C1a, C1b and C6a, C6b respectively.

The connection circuits are intended to couple the connectors C5 of the electronic modules 5 with the connectors 60a and 60b (cf. the connectors 60 on FIG. 3) able to be coupled with connectors of aircraft cabling assemblies, via the back board 4 and the connection circuits C1a, C1b and C6a, C6b.

In diagram 5b, the modules 6a and 6b have been inserted in the spaces E1 and E2 so that they come against the internal faces 110a and 110b of the edges 11a and 11b of the front face 11 and against the external faces 15a and 16a of the lateral walls 15 and 16. In this position, the ends of the handles 8a, 8b of the modules 6a, 6b, are mechanically connected to the fixed points 10a and 10b of the lateral walls 15 and 16.

By pivoting the handles 8a and 8b (arrows R3 and R4) about the fixed points 10a and 10b, the modules 6a and 6b are driven in translation along the faces 15a and 16a (arrows T3 and T4) towards the back panel 14 of the cabinet 1. The closed position of the modules 6a and 6b is reached when the connection circuits C6a and C6b are placed in contact with the connection circuits C1a and C1b (diagram 5c). The handles 8a and 8b are then in the closed position.

As shown in diagram 5d, the closed position of the circuits is locked by the lowering of the levers 7a and 7b, just like the lever 7 described with reference to diagrams 4b and 4c of FIG. 4. Locking by reversible mechanical clamping between the handles 8a, 8b of the interconnection modules 6a, 6b and the lateral walls 15 and 16 of the cabinet 1 is thus achieved.

Figure 6:
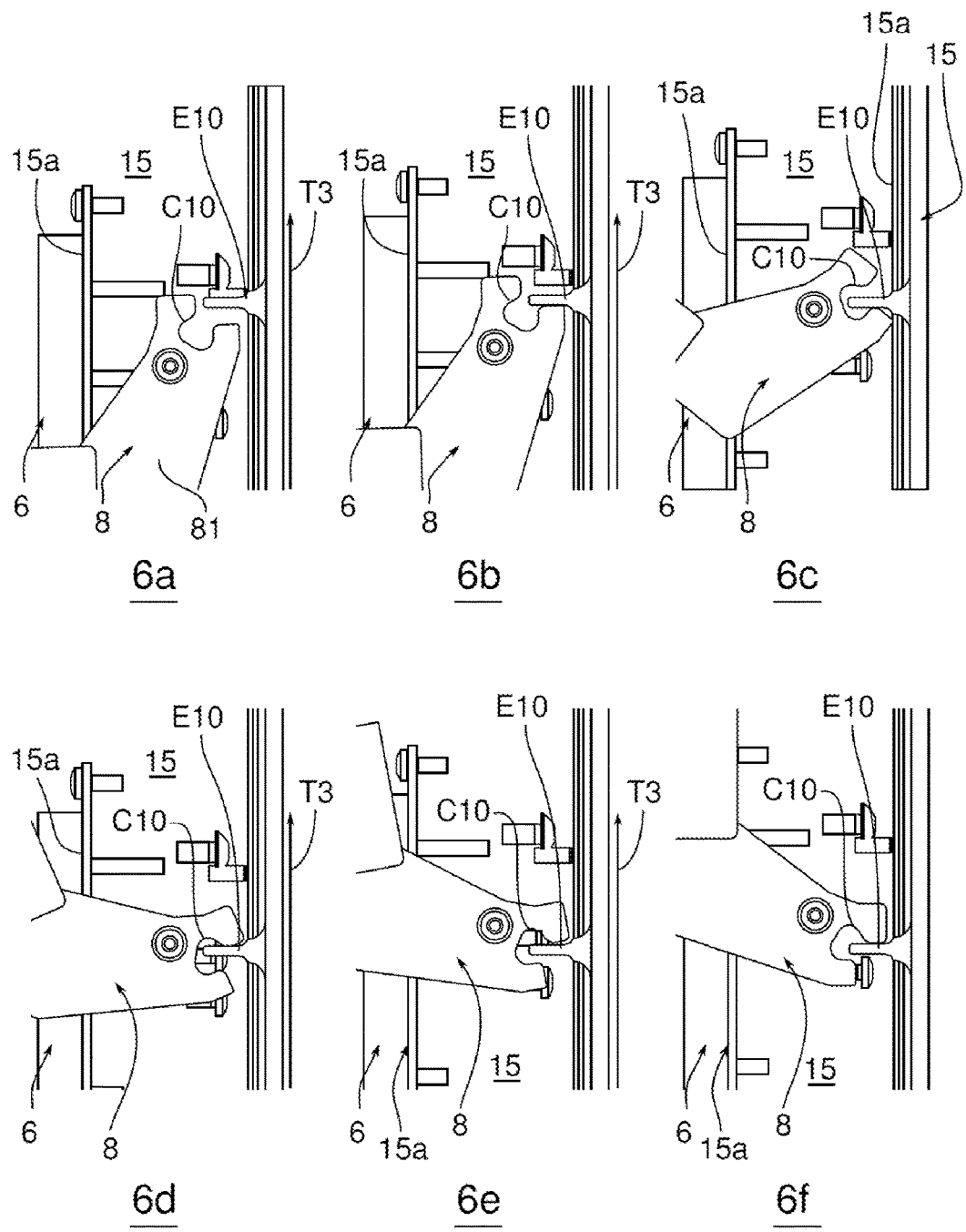
FIG. 6 shows a plan view of the progress over time (diagrams 6a to 6d) of a mechanical hook/lugs connection during the pivoting of the handle of the interconnection module of the cabinet in order to close this module on the cabinet.

The pivoting of the handle 8 (8a or 8b) of the module 6 (6a or 6b) about fixed points 10a or 10b (diagram 5b of FIG. 5) is more particularly shown in the diagrams 6a to 6d of the plan view in FIG. 6. These diagrams show the successive progress over time of a mechanical connection between a hook C10, formed at the end of the horizontal part 81 of the handle 8 (cf. FIG. 4b or 4c), and a lug E10 integral with the external face 15a of the lateral wall 15. Following the diagrams 6a to 6f, it is apparent that the hook C10 engages around the lug E10 which serves as a fixed point, like the points 10a or 10b. The handle 8 pivots about the lug E10 by the hook C10/lug E10 engagement, and the module 6 is moved in translation (arrow T3 cf. diagram 5b) during this pivoting in order to close the connection circuits of this module.

A hook similar to the hook C10 is of course present on the other horizontal end 82 of the handle 8 (cf. FIG. 3) and pivots about a lug similar to the lug E10 and arranged at an appropriate location on the external face 15a of the lateral wall 15.

Figure 7A:
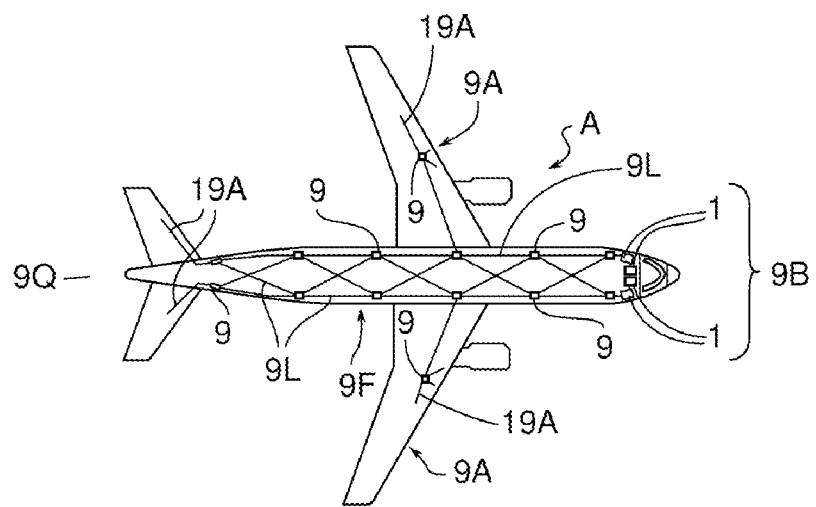
FIGS. 7a to 7c show a plan view of an architecture for the distribution of equipment in an aircraft in liaison with avionics bay cabinets installed in the nose hold (FIG. 7a), and views of this installation in perspective (FIG. 7b) and from the rear of the aircraft (FIG. 7c)

Cabinets 1 thus equipped are installed in an aircraft according to the requirements for electric/electronic equipment defined by the aircraft constructor. The aircraft plan view shown in FIG. 7a illustrates an example of distribution of equipment 9 installed in the fuselage 9F, the wings 9A and the tail 9Q of an aircraft "A".

Figure 7B:
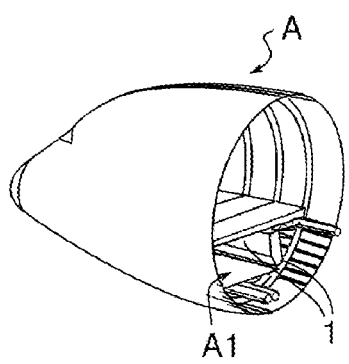
Figure 7C:
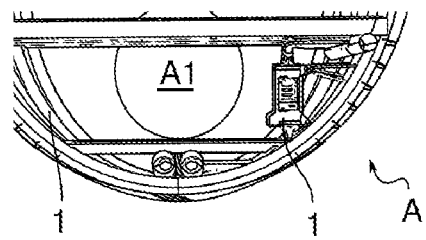

An architecture predefined as a function of the installation of the equipment is spread out as a network 9L, composed of electric and optical cabling assemblies 90, between the equipment 9 and the bay 9B constituted by cabinets 1 of the type defined above. As illustrated by the perspective and rear views of the aircraft A in FIGS. 7b and 7c, the cabinets 1 forming an avionics bay are installed, in this example, in the front cargo hold A1 of the aircraft A.

The cabling assemblies of the network 9L are partly conveyors of optical signals. Communication with the electronic modules 5 of the electronic cabinets 1 (cf. FIG. 1a) is carried out according to the block diagram of bidirectional conversion of signals shown in FIG. 8.

In this block diagram, the optical signals $S_H$ coming from cabling assemblies 90 on an Ethernet communications network $R_{E1}$ using the "1000BASE-SX" protocol are converted into electric signals $S_E$ via an optical/electric conversion interface card 101. Said interface card 101 is a card formed in the connection circuits C1a, C1b of the edges 14a, 14b of the back panel 14 of the cabinet 1 (cf. diagram 5a of FIG. 5). An example of a multi-layer conversion module is shown in FIG. 10 (see below).

The electric signals are then transmitted through the same connection circuit C1a, C1b to the computers and actuators 50 via the connectors of the back panel card 4 and the connectors C5 of the electronic modules 5 (cf. FIG. 1a)—via a back panel communications network $R_{E1}$ using a protocol compatible with that of the network $R_{E1}$, in this case the Ethernet network using the "1000BASE-KX" protocol.

The transmissions are advantageously bidirectional and fast using optical fibers, which makes it possible to overcome the problems of integration: control signals coming from the computers and actuators 50 are also transmitted to the equipment concerned via the cabling assemblies 90 and through the conversion interface 101, on the Ethernet, $R_{E2}$ and then $R_{E1}$, communication networks, in this case "1000BASE-KX" and "1000BASE-SX".

Figures 8, 9, 10:
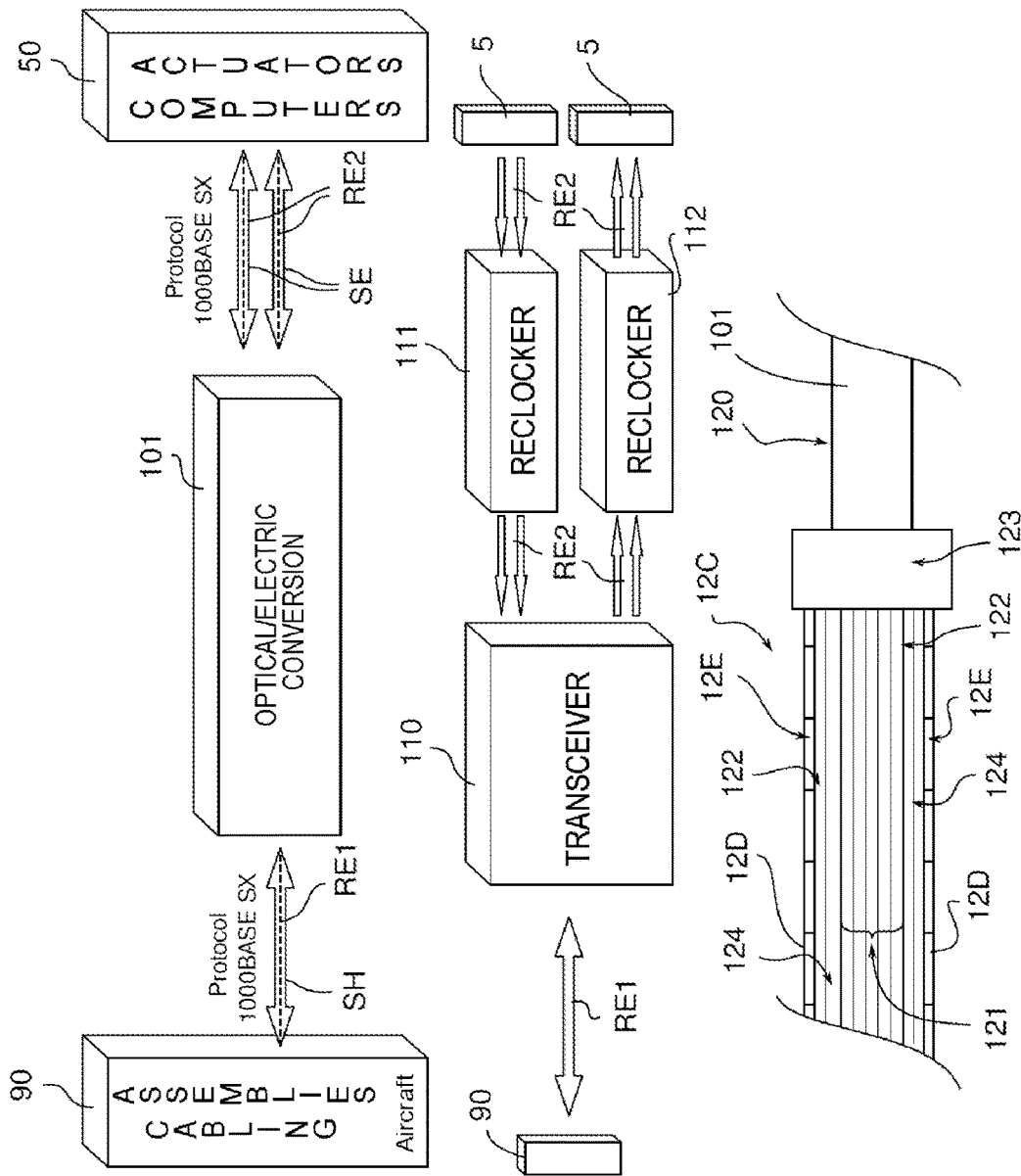
FIG. 8 is a block diagram of bidirectional opto-electric connection according to the invention between the aircraft cabling assemblies and the electronic modules inserted in an electronic cabinet.
FIG. 9 is a block diagram of block opto-electric conversion for a communication unit according to the invention.
FIG. 10 is a diagrammatic cross-section of a multi-layer printed circuit optoelectronic conversion card according to the invention.

The block diagram shown in FIG. 9 illustrates more precisely the components of the conversion interface card 101 for the signals provided by the Ethernet networks $R_{E1}$ and $R_{E2}$. The principal component is a transmitter/receiver circuit (or "transceiver" in English terminology) 110. The transceiver 110 used in this example is a component for a multi-mode fiber optic link, for example having a wavelength of 850 nm.

In order to deliver a voltage and jitter level ("jitter" is the term used in English terminology) compatible with the back panel "1000BASE-KX" protocol, distributed amplification components 111 and 112 (or "reclockers" in English terminology) are connected to the transceiver 110. The addition of these reclockers makes it possible to re-establish the signal levels specified for the computer or actuator in question.

The reclocker 111 transmits the signals emitted by the electronic modules 5 to the transceiver 110 and the reclocker 112 transmits the signals received by the transceiver 110 to the electronic modules 5. The connection between the transceiver 110 and the optical cable assemblies 90 is provided by the Ethernet network using the "1000BASE-SX" protocol $R_{E1}$ over bi-directional, single-mode optical fiber.

The invention provides a multi-layer connector 12C, such as the one shown in diagrammatic cross-section in FIG. 10, to convey the power into the printed circuit 120, which integrates a conversion interface card 101, from rear wall edge connectors C1a, Cb as far as the back panel 4 (cf. FIG. 5). The multi-layer connector 12C is connected to the printed circuit 120 by a connection terminal 123. A dissipator 12D is mounted on the external faces 12E of this multi-layer connector 12C in order to facilitate the evacuation of calories by conduction or convection.

Said multi-layer connector circuit 12C has a thickness of substantially 105 µm per layer, in this case with a specific stacking of a set 121 of five layers sandwiched between two, upper and lower, power layers 122 and 124.

The conveying of heavy currents is located on the outer faces 12E of said circuit 12C whilst respecting the top/bottom symmetry and associating these faces with the dissipator 12D to avoid the problems of heat dissipation and to limit line losses.

The conveying of fast or sensitive signals is carried out towards the exterior of the stack 121, the power layers 122 and 124 separating the heavy currents from the fast and sensitive currents.

The layers 121, 122 and 124 of the connector 12C are inserted into the connector block for 123 of the printed circuit 120 by force fitting (or by "press fit" according to English terminology). These connectors have the advantage of being easily repairable.

This multi-layer connector circuit has the advantages of carrying more heavy current whilst multiplying the number of thin connectors, allowing fast one-piece manufacture with insertion/extraction without tools, having no fitting/removal of connection elements (braids, etc.) and providing a considerable weight saving.

The invention is not limited to the examples of embodiment described and shown. In particular, the cabinet is designed in order to comply with the most severe environmental levels so that it can be calibrated using generic dimensioning and be used in all parts of the aircraft.

Moreover, the present modular system, with the interconnection modules in particular, can be used in the context of the computing network of airborne systems by assembly in an integrated modular avionics architecture, known by the term IMA (the acronym for "Integrated Modular Avionics" in English terminology).

Advantageously, the interconnection modules can be easily configurable (by CAD/CAM, by configuration matrix or equivalent) in order to meet the requirements of aircraft constructors.

The invention claimed is:

1. A method for integrating an avionic cabling assembly (9L) interconnection module (6; 6a, 6b) in an electronic cabinet (1) for housing and connecting electronic modules (5) comprising a front face (11), a back panel (14) having an internal face (140) provided with a card for connection (4) to said electronic modules (5) and two lateral walls (15, 16) having external faces (15a, 16a), the method comprising the steps of:

moving, parallel with a lateral wall (15, 16) of the cabinet (1), at least one interconnection module (6; 6a, 6b) comprising connectors (60; 60a to 60c), towards said assemblies (9L) on a principal external face (61) and a connection circuit (C6a, C6b) on a lateral face (62a, 62b);

inserting said interconnection module (6; 6a, 6b) perpendicularly to said lateral wall (15, 16) in a lateral housing space (E1, E2) limited by the external face (15a, 16a) of said lateral wall (15, 16) and edges (14a, 14b; 11a, 11b) respectively extending the back panel (14) and the front face (11);

mechanically connecting the ends (81, 82) of a handle (8) mounted, such that it pivots vertically on said module (6; 6a, 6b), on fixed points (10a, 10b; E10) on the external face (15a, 16a) of said lateral wall (15, 16);

pivoting (R3, R4) the handle (8a, 8b) in such a way that said handle ends (81, 82) rotate about fixed points (10a, 10b; E10) in order to move said module (6a, 6b) in translation (T3, T4) along the external face (15a, 16a) of the lateral wall (15, 16) and that connection circuits (C6a, C6b), arranged on a lateral face (62a, 62b) of said interconnection module (6a, 6b) in liaison with the connectors (60; 60a to 60c) of said principal external face (61) and with connectors (C1a, C1b) arranged on the internal face (140a, 140b) of said edge (14a, 14b) of back panel (14) in liaison with the connectors (C5) of the electronic modules (5) of the back panel (14), become closed one upon the other so that it is possible to couple the cabling assemblies (9L) with the electronic modules (5), and locking said module (6; 6a, 6b) in the closed position by reversible mechanical clamping between said lateral wall (15, 16) and said interconnection module (6; 6a, 6b).

2. An overall box-shaped electronic cabinet (1) for aircraft (A), equipped with at least one detachable interconnection module (6; 6a, 6b) comprising connectors (60; 60a to 60c) for coupling to cabling connectors (9L) intended for equipment (9) of the aircraft (A), the cabinet (1) being formed from a chassis (10) defining a front face (11), an upper panel (12), a lower panel (13), a back panel (14) parallel with the front face (11), and two parallel lateral walls (15, 16), the back panel (14) comprising a back card (4), called a back panel, able to be connected to a set of electronic modules (5) intended to be housed in the cabinet (1) whilst remaining extractable from the front face (11), wherein in the cabinet the rear wall (14) is extended by edges (14a, 14b) provided with connectors (C1a, C1b) able to be coupled with connectors (C6a, C6b) arranged on a lateral face (62a, 62b) of the detachable interconnection module (6a, 6b) inserted in a lateral housing space (E1, E2) limited by the external face (15a, 16a) of said lateral wall (15, 16) and edges (14a, 14b; 11a, 11b), the connectors (C1a, C1b) of the edges of the rear wall being coupled with the back panel card (4) and in that device of closing (C10, E10) and releasably locking (7) said at least one detachable interconnection module (6; 6a, 6b) are provided between an interconnection module (6; 6a, 6b) handle (8; 8a, 8b) able to pivot about fixed points (10a, 10b; E10) and the lateral wall (15, 16) of the cabinet (1) against which said module (6; 6a, 6b) is able to be placed in order to couple, in a reversible manner, the edge connectors (C1a, C1b) of the rear wall with the lateral face connectors (C1a, C1b) of the interconnection module, according to the method in claim 1, the connectors (60; 60a to 60c) for coupling with the cabling (9L) of the aircraft (A) being arranged on an external face (61) of said interconnection module (6; 6a, 6b) parallel with the lateral wall (15, 16) and in liaison with said lateral face connectors (C6a, C6b).

3. The electronic cabinet as claimed in claim 2, wherein the cabinet (1) is constituted by a low-density material chosen from aluminum-based metal alloys and composite materials based on carbon fibers.

4. The electronic cabinet as claimed in claim 2 wherein a bidirectional optical/electric conversion interface card (101) is integrated in a printed circuit (120) coupled to the connectors of the edges of the rear wall coupled to the connectors of the edges of the rear wall (C1a, C1b) via a multi-layer (121, 122, 124) connector (12C) for conveying heavy current.

5. The electronic cabinet as claimed in claim 4, wherein each layer (121, 122, 124) of the connector (12C) is inserted by force in a terminal (123) for connection to the printed circuit (120) and at least one dissipator (12E) is mounted on an external face of the multi-layer connector (12C).

6. The electronic cabinet as claimed in claim 2, wherein the fast bidirectional information is transmitted via the conversion interface card (101), between the connectors of the detachable interconnection module (60; 60a to 60c) coupled to the aircraft cabling connector technology and the electronic modules (5) of the cabinet (1) using optical fibers.

7. The electronic cabinet as claimed in claim 2, wherein the electric and optical connections are made between the connectors of the detachable interconnection module (60; 6a to 60c) coupled to the aircraft cabling connector technology and the electronic modules (5) of the cabinet (1) via appropriate Ethernet protocols.

8. The electronic cabinet as claimed in claim 2, wherein the optical/electric conversion interface card (101) comprises a transmitter/receiver (110) associated with two distributed amplification reclockers (111, 112).

9. The electronic cabinet as claimed in claim 2 wherein the device of closing the interconnection modules (6; 6a, 6b) comprise hooks (C10) mounted at the ends (81, 82) of the handle (8) of the interconnection module (6; 6a, 6b), these hooks (C10) are mounted engaged on lugs (E10) in order to pivot about these lugs (E10) by rotation of the handle (8) and to move the interconnection module (6; 6a, 6b) in translation until it reaches the extended edges (14a, 14b) of the rear wall (14) in the closed position, and the locking means comprise a lever (7) coming from the side wall (15, 16) and able to lock the handle (8) in the closed position by clamped connection.

10. The electronic cabinet as claimed claim 2, wherein the chassis (10) of the cabinet (1) comprises intermediate inclined (P1, P2) and/or vertical walls (P3, P4) between the upper and lower panels (12, 13) and respectively at least one of the front (11) and/or rear (14) faces, these intermediate walls (P1 to P4) being provided with ventilation openings (O1 to O4) in order to allow an alternating flow of ventilation air (F1, F2) in the cabinet (1) between the openings (O1, O2; O3, O4) of the intermediate walls (P1 to P4) formed in liaison with a same face (11, 14).

11. The electronic cabinet as claimed claim 2, wherein the cabinet (1) has a self-supporting suspension by rods structure (19) able to allow the installation of the cabinet (1) in a housing area of the aircraft making it possible to allow periodic decoupling.

12. An aircraft comprising an avionic bay (9B) constituted by a set of cabinets (1) as claimed in claim 2, wherein the cabinets (1) are arranged in such a way as to allow a flow of air between them and to transmit control signals to electric/electronic equipment (9) of the aircraft (A) via electric and/or optical cabling assemblies (9L).

13. The aircraft as claimed in claim 12, comprising a fuselage (9F), wings (9A), a cockpit, a cockpit floor, a nose hold and a cargo hold (A1), characterized in that the cabinets (1) of the bay (9B) are arranged in the nose hold, the cargo hold (A1) and/or the floor of the cockpit, and in that it is provided with electric/electronic equipment (9) distributed in the fuselage (9F) and the wings (9A) of the aircraft (A) and coupled with the cabinets (1) in the bay (9B) via electric and/or optical cabling assemblies (9) spread out according to an architecture integrating the distribution of the equipment (9) in the aircraft (A).

* * * * *